United States Patent [19]
Pedersen

[11] Patent Number: 5,815,003
[45] Date of Patent: Sep. 29, 1998

[54] PROGRAMMABLE LOGIC INTEGRATED CIRCUITS WITH PARTITIONED LOGIC ELEMENT USING SHARED LAB-WIDE SIGNALS

[75] Inventor: Bruce B. Pedersen, San Jose, Calif.

[73] Assignee: Altera Corporation, San Jose, Calif.

[21] Appl. No.: 497,632

[22] Filed: Jun. 30, 1995

Related U.S. Application Data

[63] Continuation-in-part of Ser. No. 334,879, Nov. 4, 1994, abandoned.

[51] Int. Cl.⁶ .................................................. H03K 7/38
[52] U.S. Cl. .................................................. 326/39; 326/41
[58] Field of Search .................... 326/39, 40, 41

[56] References Cited

U.S. PATENT DOCUMENTS

| | | | |
|---|---|---|---|
| 4,677,318 | 6/1987 | Veenstra | 326/40 |
| 4,758,985 | 7/1988 | Carter | 326/41 |
| 5,109,353 | 4/1992 | Sample et al. | 364/578 |
| 5,121,006 | 6/1992 | Pedersen | 326/38 |
| 5,136,188 | 8/1992 | Ha et al. | 326/39 |
| 5,220,214 | 6/1993 | Pedersen | 326/46 |
| 5,250,859 | 10/1993 | Kaplinsky | 326/40 |
| 5,258,668 | 11/1993 | Cliff et al. | 326/41 |
| 5,260,611 | 11/1993 | Cliff et al. | 326/39 |
| 5,274,581 | 12/1993 | Cliff et al. | 364/784 |
| 5,309,046 | 5/1994 | Steele | 326/39 |
| 5,317,210 | 5/1994 | Patel | 326/40 |
| 5,350,954 | 9/1994 | Patel | 326/39 |
| 5,352,940 | 10/1994 | Watson | 326/44 |
| 5,359,242 | 10/1994 | Veenstra | 326/39 |
| 5,436,574 | 7/1995 | Veenstra . | |

OTHER PUBLICATIONS

Patterson et al.; "Computer Architecture: A Quantitative Approach"; copyright 1990 by Morgan Kaufmann Publishers, Inc.; pp. 204–206.

Altera Flex 8000 Data Sheet, Aug. 1993, ver. 3.

*Primary Examiner*—Edward P. Westin
*Assistant Examiner*—Richard Roseen
*Attorney, Agent, or Firm*—Townsend and Townsend and Crew

[57] ABSTRACT

A programmable logic device (10) has a number of programmable logic elements (LEs) (12) which are grouped together in a plurality of logic array blocks (LABs) (14). An LE incorporates a plurality of partitioned look-up tables (40a, 40b) that may be selectively connected to its inputs and outputs by means of a number of multiplexers (44a–d, 46). Shared LAB-wide input lines (43a, 43b) provide a shared input line into a number of LEs in a LAB. A digital information processing system (500) incorporating the invention is disclosed. A wide-input AND gate (74) combining the outputs of a number of LEs is disclosed.

26 Claims, 4 Drawing Sheets

PROGRAMMABLE LOGIC INTEGRATED CIRCUITS WITH PARTITIONED LOGIC ELEMENT USING SHARED LAB-WIDE SIGNALS

This patent application is a continuation-in-part of Ser. No. 08/334,879 filed Nov. 4, 1994 now abandoned.

BACKGROUND OF THE INVENTION

The present invention relates to the field of digital electronic circuits. More specifically, in one embodiment the present invention provides an improved programmable logic device with enhanced logic element using shared lab-wide signals as well as associated methods of operation.

Programmable logic devices (PLDS) are well known to those in the electronics art. Such programmable logic devices are commonly referred to as PALs (Programmable Array Logic), PLAs (Programmable Logic Arrays), FPLAs (Field Programmable Logic Arrays), EPLDs (Electronically Programmable Logic Devices), EEPLDs, LCAs (Logic Cell Arrays), FPGAs (Field Programmable Gate Arrays), and the like. Such devices are used in a wide array of applications where it is desirable to configure or program an off the shelf device for a specific application. Such devices include, for example, the well known Classic™ EPLDs, MAX® 5000 EPLDs, and FLEX® EPLDs all made by Altera®.

These devices, while similar in some aspects of overall functionality, may be of very different types in terms of circuit architecture. One family of PLDs uses a sum-of-products (SOP) architecture whereby each output is the ORed sum of a number of ANDed product terms of the inputs. This family is represented by the Altera MAX® and Classic™ 5000 EPLDs. Another family of PLDs uses look-up tables (LUTS) to perform logic functions. This family is represented by the Altera FLEX® EPLDs. The present invention relates to PLD's that use LUTs to perform logic functions.

Modern PLDs generally are constructed from small functional units variously referred to as logic modules or macrocells and herein referred to as logic elements (LEs). These LEs are typically identical or nearly identical throughout the PLD and perform a function that is a sub unit of the function of the entire PLD. For example, in a prior art PLD based on an LUT architecture, the LEs might each be four input/one output LUTs. PLDs generally include an interconnect structure of conductors to provide a mechanism for selectively connecting the inputs and outputs of the LEs in order to perform the PLD functionality.

Larger PLD's of both the SOP and LUT type generally group the smaller LEs into larger functional units herein referred to as logic array blocks (LABs). The LABs can contain within them a local LAB interconnect that allows signals in one LE to be selectively connected to signals in a different LE in the same LAB and that transmits signals from the global interconnect to the inputs of the individual LEs. The LABs may be connected to one another and to input and output circuits by means of the global interconnect.

While such devices have met with substantial success, such devices also meet with certain limitations.

For example, PLD's that are based on large numbers of identical LEs certain limitations in programming flexibility based on the structure of the LE. A typical size for an LE is a four-input look-up table. This size look-up table is optimum for many functions. However, certain logic functions must use several LEs because of the limitations of the four-input LUT design.

One modification to a four-input LUT that has been proposed is the partitioning of the LUT into smaller LUTS. These smaller LUTs can perform all of the logic function of the larger LUTs but also offer added flexibility. One such partitioning scheme was discussed in co-assigned U.S. Pat. No. 5,274,581 which was co-invented by the inventor of the present invention and is incorporated herein by reference. In that patent, it was discussed that a four-input LUT could be implemented as two three-input LUTs with various multi-plexing circuitry. The LE discussed in that patent provided enhanced functionality when LEs where used as adders or counters. The discussed LE was not, however, optimized to perform multiplexing functions or more complex LAB-wide functions.

From the above it is seen that an improved programmable logic device is desired.

SUMMARY OF THE INVENTION

The invention provides an improved programmable logic device for use in digital circuits and systems in which a LE is implemented as at least two LUTs and where LUTs are connectable to one or more LAB-wide input signals. This design allows for far larger and more complex logic functions to be implemented in a single LAB than in prior art PLDs.

A computer system or other digital processing machine incorporating the invention will benefit from the added flexibility and reprogrammability of the PLD.

DESCRIPTION OF THE INVENTION

For the sake of clarity, the invention will be explained with reference to a PLD architecture that was disclosed in co-assigned U.S. Pat. No. 5,260,611 (the '611 patent) which is incorporated herein by reference. Some figures from that patent are reproduced here to aid in an understanding of the invention. However, it will be apparent to one skilled in the art that the invention may be used in a very wide variety of different PLD architectures including architectures that are fundamentally different from that disclosed in the '611 patent.

Figure 1:
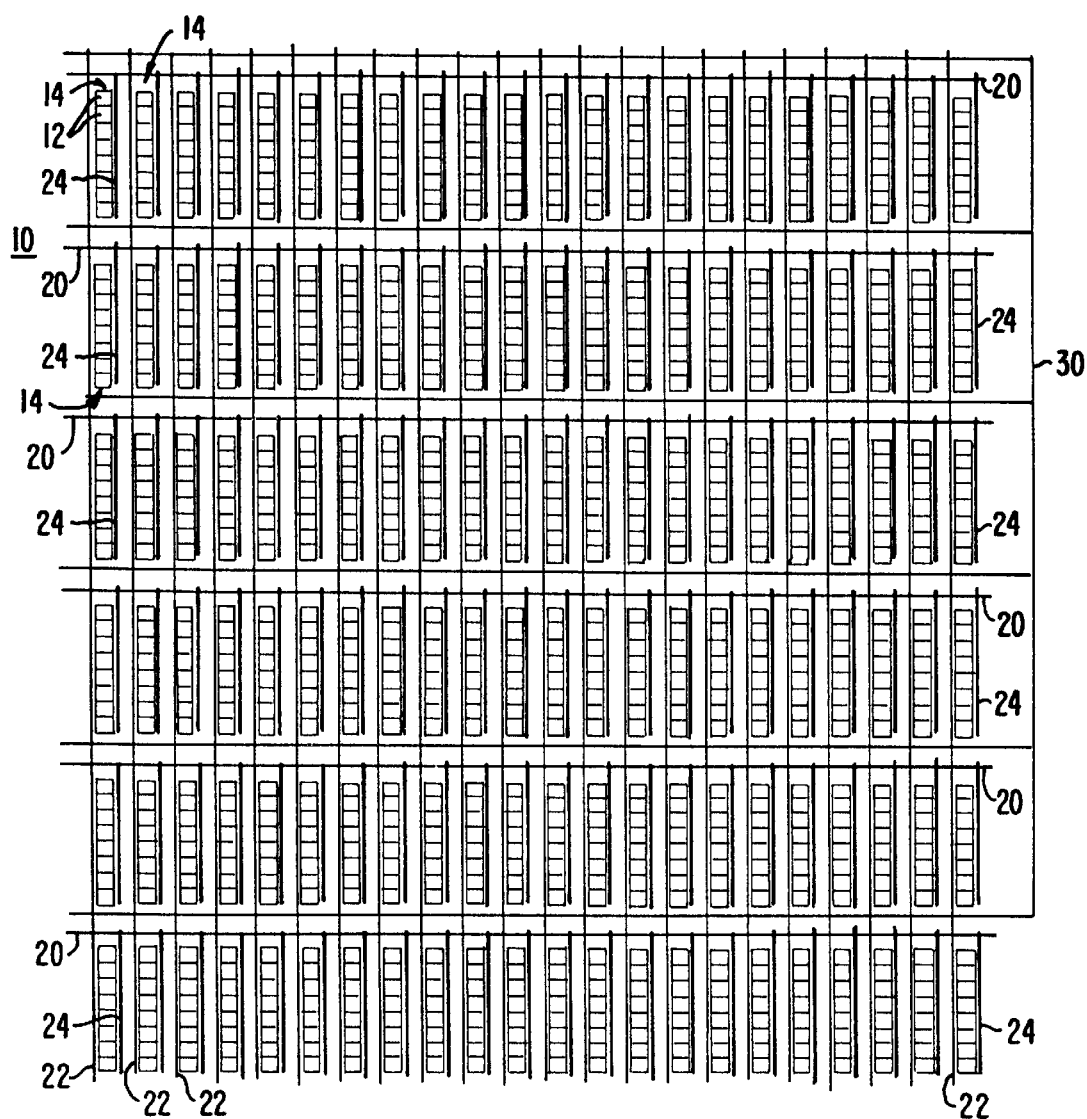
FIG. 1 is a simplified block diagram of a prior art PLD.

FIG. 1 shows the overall organization of an illustrative prior art PLD integrated circuit 10. Many details of this circuit not necessary for an understanding of the present invention are discussed in co-assigned U.S. Pat. No. 5,260,611. Not all of the conductors employed in circuit 10 are shown in FIG. 1, but enough is shown in this figure for the present discussion. Each LE 12 is represented by a small square in FIG. 1. LEs 12 are grouped together in groups of eight in this particular example. Each of these groups is referred to as a logic array block (LAB) 14. LABs 14 are arranged in six horizontal rows and twenty two vertical columns on circuit 10. Accordingly, there are a total of one hundred thirty two LABs 14 and one thousand fifty six LEs 12 on circuit 10. Each LE 12 is capable of performing a relatively elementary logic function, but extremely complex logic can be performed by variously interconnecting the LEs.

The interconnection circuitry shown in FIG. 1 includes groups of so-called global horizontal conductors (or global horizontal interconnect) 20 interspersed between the horizontal rows of LABs and groups of global vertical conductors (or global vertical interconnect) 22 interspersed between the vertical columns of LABS. These conductors are global in the sense that they extend along an entire row or column of LABs and are not localized to one LAB. Programmable interconnections can be made between select intersecting horizontal and vertical conductors in order to apply signals on the vertical conductors to the horizontal conductors. Although other numbers of conductors can be used if desired, in the depicted embodiment, there are one hundred seventy six conductors in each group of global horizontal conductors 20 and sixteen conductors in each group of global vertical conductors 22. In one specific embodiment, programmable connections are possible between a vertical conductor 22 and just one horizontal conductor 20 in each of the six horizontal rows that the vertical conductor crosses. This limitation is imposed on the general interconnect because the circuitry needed selectively to allow a connection between intersecting conductors takes up a certain amount of area on the chip and this chip area is limited.

The interconnection circuitry shown in FIG. 1 further includes groups of vertical LAB input conductors 24 associated with each LAB 14 for conveying signals from the global horizontal conductors 20 intersected by conductors 24 into the LEs 12 in that LAB. The conductors 24 are part of the LAB interconnect which is local to just one LAB. Finally, the interconnection circuitry shown in FIG. 1 includes a set of universal fast interconnect conductors 30 which are globally connected to all LABs and are designed to transmit fast signals throughout the PLD. Although other numbers of conductors can be used if desired, in the depicted embodiment there are twenty four conductors in each group of LAB input conductors 24 and there are four universal fast conductors 30.

Figure 2:
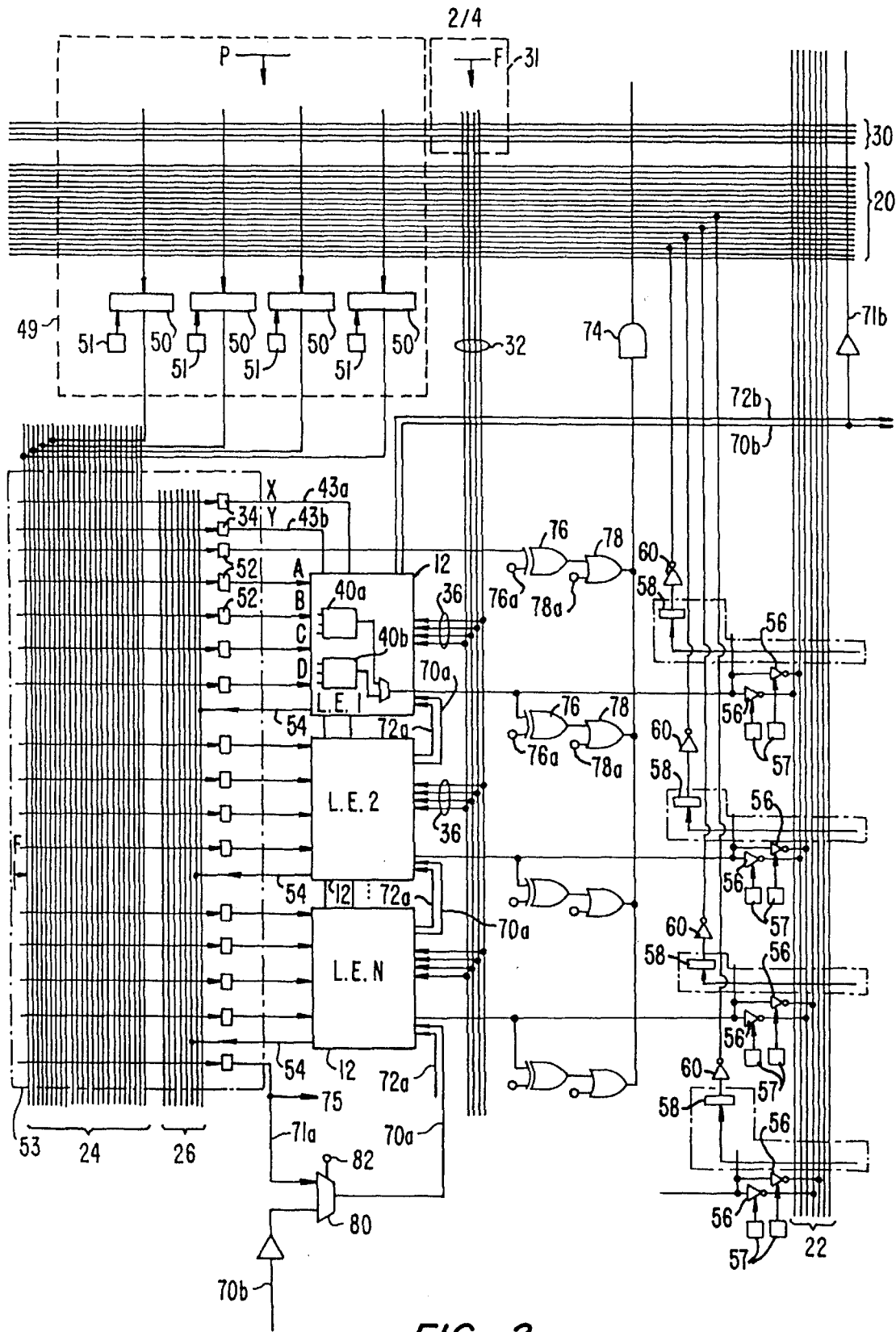
FIG. 2 is a schematic block diagram of part of a logic array block with a partitioned logic element and shared input signals according to the invention. Alternatively, some or all LEs in a device could have multiple outputs, and each of these multiple outputs could be inputs to AND gate 74.

FIG. 2 shows one possible implementation of part of a typical LAB 14 incorporating enhancements according to the invention. Three representative LEs 12 are shown. According to the invention, these LEs 12 each include two LUTs 40a and 40b as well as associated circuitry that is shown in more detail in FIG. 3. FIG. 2 also illustrates LAB-wide input signals 43a and 43b which are input signals that are shared among the LEs 12 in LAB 14. These shared signals are connectable to the local interconnect through programmable logic connectors 34.

In addition to the above-described representative LEs 12, FIG. 2 shows portions of representative global horizontal conductors 20, global vertical conductors 22, local LAB input conductors 24, local inter-LAB feedback conductors 26, and universal fast conductors 30. Each of LAB input conductors 24 can be connected to a selected one (or more) of conductors 20 and 30 via a programmably controlled programmable logic connector ("PLC") 50 (only some of which are shown in FIG. 2). Local inter-LAB conductors 26 connect only to inter-LAB signals and are used primarily for feed-back of LE outputs through lines 54 to the inputs of other LEs in the same LAB.

PLCs 50 can be implemented in any of a wide variety of ways. For example, each PLC 50 can be a relatively simple programmable connector such as a plurality of switches for connecting any one of several inputs to an output. Examples of components suitable for implementing PLCs 50 are EPROMs, EEPROMs, pass transistors, transmission gates, antifuses, laser fuses, metal optional links, etc. The components of PLCs 50 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable). In the depicted embodiment each PLC 50 is a 15-to-1 multiplexer which is controlled by programmable function control elements ("FCEs") 51 to connect one of its fifteen inputs to its output. Each of the fifteen inputs is the signal on a predetermined respective one of conductors 20 or 30. There is one PLC 50 for each of the twenty four LAB input conductors 24. Each of conductors 20 and 30 is connected to two of PLCs 50. Accordingly, each of conductors 20 and 30 is connectable to two of conductors 24. The letter P and the associated arrow symbol inside dotted line 49 indicate that the population of connections from conductors 20 and 30 to the inputs of each of PLCs 50 is a partial population meaning that not every intersection indicates a possible interconnection.

Like PLCs 50, FCEs 51 can also be implemented in any of several different ways. For example, FCEs 51 can be SRAMs, DRAMs, first-in first-out ("FIFO") memories, EPROMs, EEPROMS, function control registers ferroelectric memories, fuses, antifuses, or the like.

Each of the four data inputs to each LE 12 can be connected to any one (or more) of LAB input conductors 24 and/or any one (or more) of local conductors 26 via a PLC 52, as can each of the shared data input connectors 43a and 43b. PLCs 52 (and similar PLCs 34) may have any of the characteristics described above for the general case of PLCs 50. However, in the depicted, presently preferred embodiment each of PLCs 52 (and each similar PLC 34) is a 32-to-1 multiplexer so that any one of the twenty-four LAB input conductors 24 or any one of the eight local conductors 26 can be connected to each LAB data input. Accordingly, the letter F and the associated arrow symbol inside chain dotted line 59 indicate that the population of connections from conductors 24 and 26 to PLCs 34 and 52 is a full population meaning that each intersection of lines indicates a possible interconnection. With these interconnections just described, any of the signals on the global horizontal lines 20 in that row or on universal fast interconnects 30 may be connected to any of the LE inputs. To avoid overcrowding the drawing, the FCEs (similar to above-described FCEs 51) for programmably controlling PLCs 34 and 52 are not shown separately, but rather are assumed to be part of elements 34 and 52.

Other circuitry shown in FIG. 2 is wide-input AND gate 74. This AND gate is connectable to the outputs of up to all of the LEs 12 in LAB 14 as shown. The LE 12 output lines are connectable to AND gate 74 via XOR gates 76 which provide a selectable inversion function under control of FCE 76a and OR gates 78, which allows selectable connection of any of the LE outputs to AND gate 74. The details of these circuitry is the subject of related co-pending U.S. patent application Ser. No. 08/497,165. As shown, the output of AND gate 74 may be connectable to lines in the global interconnect 20 and 30 and AND gate 74 may include one or more input lines 79 connectable to the LAB-based interconnects 24 or 26.

There are two other types of LE interconnections shown in FIG. 2 that will be discussed. The first of these is carry chain interconnection represented in part by conductors 70a and 70b. These interconnections allow a carry out output of each LE 12 to be used as a carry in input to an adjacent or nearby LE as shown, for example, in commonly assigned, co-pending patent application Ser. No. 07/880,752 incorporated herein by reference for all purposes. For example, carry chain conductors 70a allow the carry out output of each LE 12 shown in FIG. 2 to be the carry in input to the next higher LE in that Fig. Similarly, carry chain conductor 70b runs from the top-most LE 12 in the LAB fragment shown in FIG. 2 to the bottom-most LE in the horizontally adjacent LAB in the adjacent column of LABS. This allows the carry chain to continue from LAB to LAB if desired. Also illustrated in FIG. 2 is an improvement to the LAB carry-chain which is fully discussed in related co-pending U.S. patent application Ser. No. 08/497,213. This improvement consists of LAB-based interconnect carry input connection 71a, selector 80, FCE 82 and other associated circuitry as described in the cited application.

A direct carry chain is represented by a direct carry_in 70a and a direct carry_out 70b. According to this aspect of the invention, the carry_in may also be connected to the global interconnect. In a specific embodiment, this is accomplished through use of carry_in selector 80. Carry_in selector 80 is controlled by a FCE 82 such that the carry_in to LE 1 may come from either direct carry_out 70b from an adjacent LAB or may come from one of the signals in the global interconnect through LAB-input carry_in line 71a, depending on the state of FCE 82. The line 71a that optionally connects to the carry_in of a LAB may be dedicated to this purpose or may be shared by other signals such as a LAB-wide clock signal as illustrated by the additional connection 75 in FIG. 2.

At the carry_out of a LAB according to the invention, the carry_out from the last LE in the LAB is provided to the direct carry chain through direct carry_out line 70b and is also provided to the global interconnect through global interconnect carry_out line 71b.

The other type of LE interconnection remaining to be discussed is illustrated by representative conductors 72a and 72b in FIG. 2 (see also commonly assigned, co-pending application Ser. No. 07/880,888). These conductors are called cascade connect conductors. They allow the data outputs of adjacent or nearby LEs 12 to be logically combined, if desired, to perform more complex logic functions without the need to pass intermediate data through the general interconnection network. The manner in which cascade connect conductors 72 are employed in the LEs is shown in detail in FIG. 12.

Figure 3:
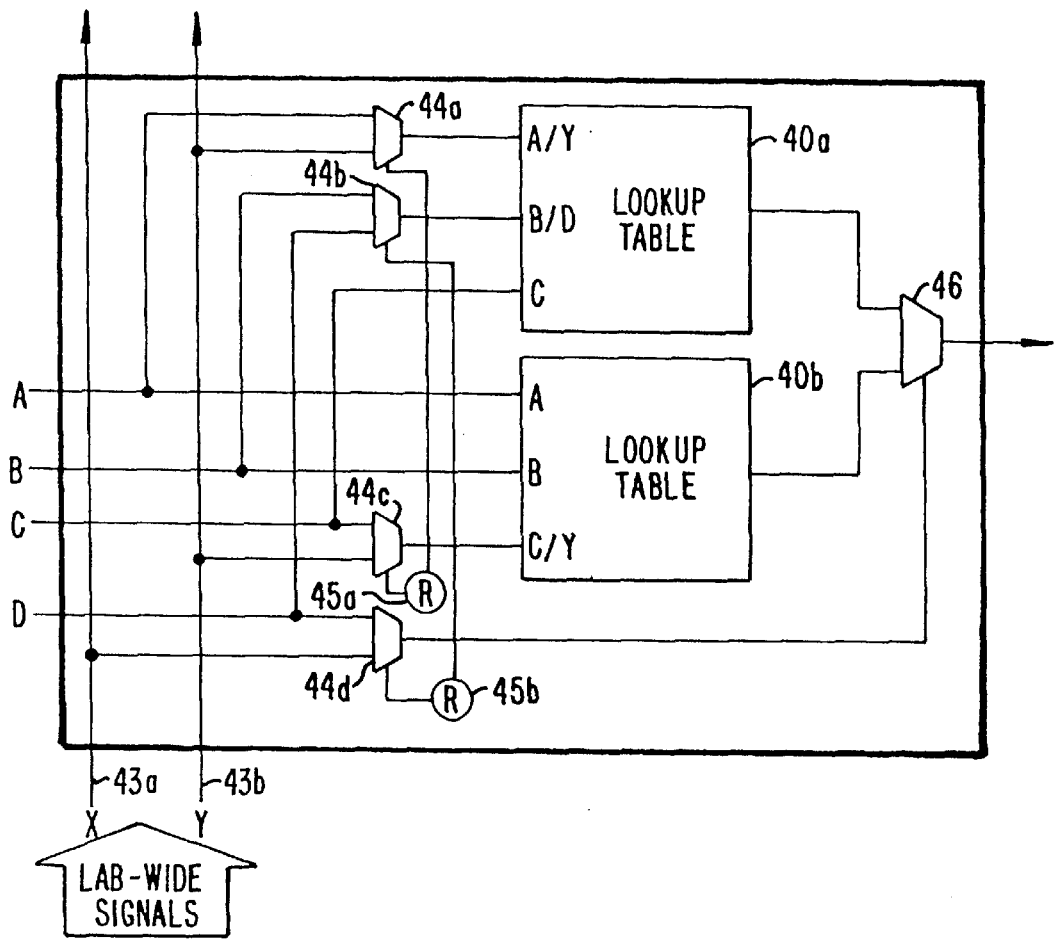
FIG. 3 is a schematic block diagram of a logic element with multiple look-up tables and shared input signals according to the invention.

FIG. 3 is a simplified block diagram of a LE 13 showing only those details necessary to illustrate the invention. In this aspect of the invention, the look-up table of a logic element has been partitioned into two 3-input look-up tables 40a and 40b whose inputs can either be connected to one of the standard input lines dedicated to the logic element, or, according to the invention, be connected to one of the global LAB-lines 43a or 43b that feed multiple LEs 12.

According to an embodiment of the invention illustrated in FIG. 3, LE 12 is equipped to receive inputs A, B, C, and D that are assigned to that one LE and are unshared with other LEs. LE 12 is also equipped to receive shared inputs X and Y that are shared among several to all LEs in a LAB. The six inputs are selectively connectable to the inputs of look-up tables 40a and 40b via three input multiplexers 44a–c. Input multiplexer 44a selects between inputs A and Y and is connected to look-up table 40a. Input multiplexer 44b selects between inputs B and D and is connected to look-up table 40a. Input multiplexer 44c selects between inputs C and Y and is connected to look-up table 40b. A fourth input multiplexer 44d selects between inputs D and X and is connected to the select signal of an output multiplexer 46. Output multiplexer 46 selects between the outputs of look-up tables 40a and 40b and connects one of those outputs to the output of LE 12. Alternatively, some of all LEs in a device could have multiple outputs, each being a logic function of the inputs. In the depicted embodiment, the input multiplexers have their select lines connected to a programmable store or FCE element. FCE 45a provides the select signal for multiplexers 44a and 44c. FCE 45b provides the select signal for multiplexers 44b and 44d.

According to an embodiment of the invention, a logic element 12 can be configured to be a function H(a,b,c,d), as would be standard for four-input LUTs in the prior art, or as F(y,b,c)&d # G(a,b,y)&!d, or as F(a,b,c)&x # G(a,d,c)&!x, or as F(a,b,y)&x # G(c,d,y)&!x, where a,b,c and d are signals from the logic element's dedicated input lines, while x and y are signals provided according to the invention that are global to the LAB. The combination according to the invention of a LE constructed of partitioned LUTs and of a number of LAB-wide input signals allows functions of greater complexity to be implemented in a single LE as compared to a standard prior art LE. For example, a four-input multiplexer selectable by signals X and Y could fit on a single logic element built according to this aspect of the invention, whereas two prior art LEs would be required.

Figure 4:
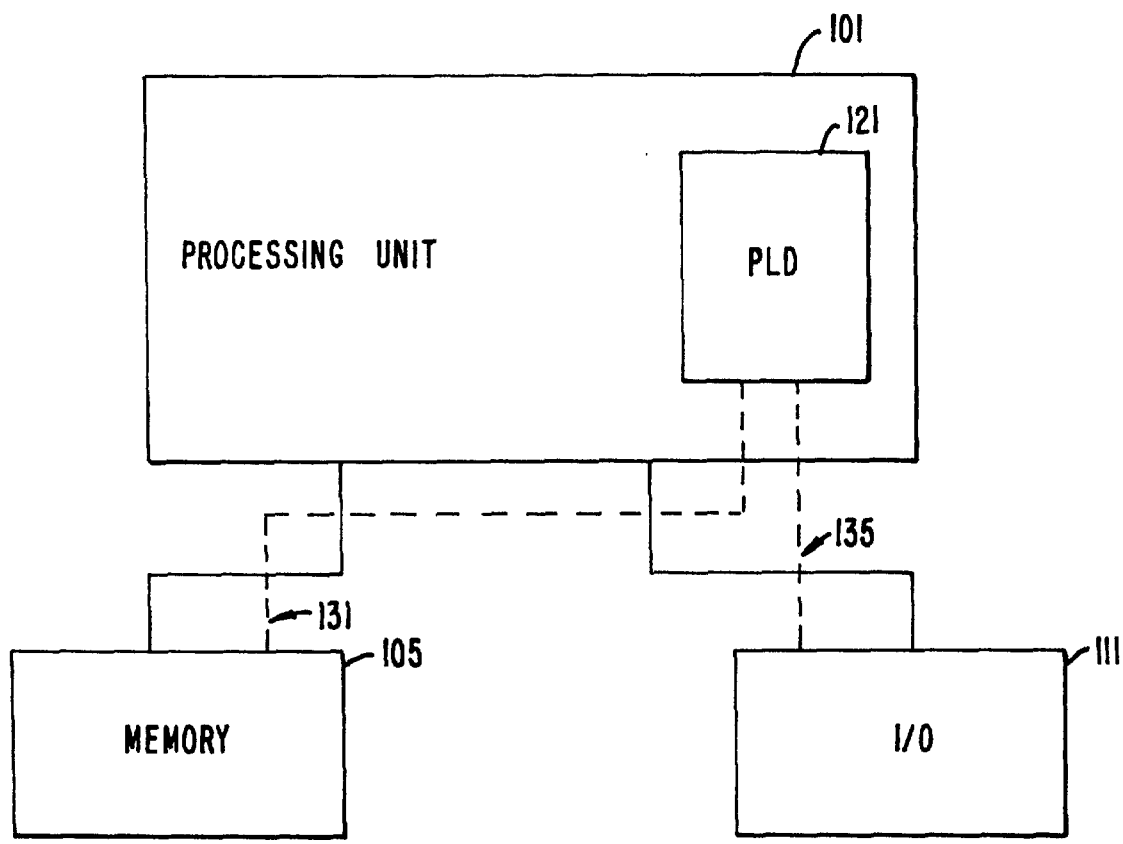
FIG. 4 is a block diagram of a digital processing system including a PLD with LAB-based output routing according to the invention.

FIG. 4 shows a block diagram of a digital system within which the present invention may be embodied In the particular embodiment of FIG. 4, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. I/O 111 may also be a connection or bus to another processing system that provides input or receives output from 101. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD may serve many different purposes within the system in FIG. 4. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 4 may embody a plurality of PLDs 121, each performing different system functions.

The system shown in FIG. 4 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 4, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

The invention has now been explained with reference to specific embodiments. However, a number of variations to the invention will be obvious to anyone with skill in the art. For example, the invention need not be limited to circuits that are commonly thought of as PLDs; other types of configurable counter circuits or adder circuits may employ the invention. Also, the particular design of the LABs is not determinative. The invention may be used with SOP-based LABs as well as LUT-based LABs. The invention may also be employed in PLDs having a wide variety of LAB and LE architectures and a number of different interconnect strategies. Additionally, the particular configurations of the global and local interconnect are not determinative circuits in which the invention may be employed may employ either a more limited or more extensive global interconnect than those depicted in the specific embodiments. Finally, systems incorporating the invention may be any type of information processing system or subsystem. It is therefore intended that the invention not be limited except as specified in the attached claims.

What is claimed is:

1. A configurable electronic device comprising:
   a plurality of logic elements grouped into a plurality of logic blocks wherein at least one of said logic blocks comprises outputs and an array of local interconnection lines within said logic block;
   a plurality of shared input signals connectable to a plurality of logic elements in at least one logic block; and
   at least one logic element comprising:
      an output and a plurality of inputs wherein said output is a logical function of said inputs; and
      at least two look-up tables said look-up tables having inputs selectively connectable to said inputs of said logic element and having outputs selectively connectable to said output of said logic element;
   a general interconnect structure programmably connecting the outputs of one of said logic blocks to said array of local interconnection lines of another of said logic blocks.

2. The configurable electronic device according to claim 1 wherein a plurality of said logic elements in one of said logic blocks each have an output selectively connectable to a wide-input AND gate.

3. The configurable electronic device according to claim 1 wherein said at least one logic element further comprises;
   a plurality of input multiplexers for selectively connecting said logic element inputs and said shared inputs to inputs of said look-up table; and
   an output multiplexer for selectively connecting outputs of said look-up table to said logic element outputs.

4. The configurable electronic device according to claim 3 wherein data in said plurality of look-up tables is stored in static random access memory.

5. The configurable electronic device according to claim 1 further comprising a plurality of multiplexers with inputs connected to said general interconnect structure and outputs connected to said array of input interconnections.

6. The configurable electronic device as recited in claim 1 wherein said general interconnect structure comprises an array of vertical and horizontal interconnect lines between said logic blocks.

7. The configurable electronic device as recited in claim 1 wherein said at least one logic block further comprises:
   a carry input line; and
   a carry-in selector with its output coupled to the carry input line, one of its selectable inputs coupled to a direct carry output of an adjacent logic block and another of its selectable inputs selectively coupled to said array of global interconnection lines within said at least one logic block.

8. The configurable electronic device according to claim 2 wherein said output may be selectively inverted prior to connection to said wide-input AND gate.

9. The configurable electronic device as recited in claim 7 wherein said array of local interconnection lines is fully populated to inputs of individual logic elements in said logic block and to said input of said carry-in selector.

10. The configurable electronic device as recited in claim 1 wherein the configurable electronic device is connected to a system via a plurality of input/output connections in said device for connecting signals on said global interconnect to elements of said system, said system comprising:
   a processing unit;
   a memory; and
   an input/output interface, each operably connected to one another so that data signals may be communicated between them.

11. The configurable electronic device according to claim 1 wherein said at least one logic element has an output which may be programmably connected to its inputs to perform any one of the functions: H(a,b,c,d); F(y,b,c)&d # G(a,b,y)&!d; F(a,b,c)&x # G(a,d,c)&!x; or F(a,b,y)&x # G(c,d,y)&!x where a, b, c, and d represent one of said plurality of inputs of said logic element, x and y represent shared inputs connected to a plurality of logic elements, & represents a logical AND operation, ! represents a negation, and # represents a logical OR operation, and H, F, G represent any combinatorial logic function of the indicated inputs.

12. The configurable electronic device according to claim 8 wherein said plurality of input multiplexers is controlled by a plurality of programmable stores and said output multiplexer is controlled by the output of one of said input multiplexers.

13. A method in a programmable logic device of enhancing functionality of logic elements comprising the steps of:
   grouping said logic elements into a plurality of logic blocks wherein at least one of said logic blocks comprises outputs and an array of local interconnection lines within said logic block;
   constructing for at least one logic block a plurality of shared input signal lines for providing shared input signals to a plurality of logic elements;
   generating an output of at least one of said logic elements in said at least one logic block through use of first and second look-up tables, said look-up tables having inputs selectively connectable to unshared inputs of said logic element and to said shared input signal lines of said logic block; and
   providing a means for selectively connecting outputs of said logic elements to outputs of said look-up tables.

14. A configurable logic device comprising:
   a plurality of logic array blocks (LABS), arranged in a plurality of rows and columns, at least one LAB having a plurality of inputs and-outputs and capable of performing a logic function such that said at least one LAB's outputs each represent logical functions of its inputs, said logic function being programmable during chip manufacture or use;
   a general interconnect structure comprising a plurality of rows of conductors and a plurality of columns of conductors, said general interconnect structure capable of routing select signals between said columns of conductors and said rows of conductors;
   LAB output lines for selectively connecting said LAB outputs to said general interconnect structure;
   at least one LAB-based interconnect associated with a particular LAB capable of connecting selected lines of said general interconnect to selected input lines of said LAB;
   wherein at least one LAB is comprised of a plurality of logic elements each of said logic elements having an output and a plurality of inputs and each of said logic elements performing a function such that its output is a logical function of its inputs said at least one LAB including at least one shared LAB-wide input line selectively connected to inputs of said logic elements said logic elements comprising:
   at least two look-up tables, said look-up tables each having an output and a plurality of inputs;
   a plurality of input multiplexers for selectively connecting said plurality of logic element inputs to said look-up table inputs; and
   an output multiplexer for selectively connecting one output of said plurality of look-up tables to said output of said logic element.

15. The configurable electronic device according to claim 14 wherein a plurality of said logic elements have four input lines connectable to up to four different lines in said LAB-based interconnect and wherein a plurality of said look-up tables are three input look-up tables and wherein there are two shared LAB-wide input lines selectively connected to inputs of said plurality of said look-up tables.

16. The configurable logic device of claim 14 wherein said at least one LAB-based input interconnect is a fully populated interconnection between inputs to logic circuits of said LAB and outputs of a plurality of multiplexers, said multiplexers having their inputs connected to conductors in said general interconnect.

17. The configurable logic device of claim 16 wherein the outputs of said multiplexers are selected by a programmable store.

18. The configurable logic device of claim 17 wherein the programmable store is an SRAM cell.

19. The configurable logic device of claim 14 wherein at least one shared LAB-wide input line may be selectively connected to a line in said LAB-based interconnect.

20. A digital information processing system comprising:
   an input device;
   an output device;
   a main processor;
   a memory, each operably connected to one another so that data signals may be communicated between said input device, said main processor, said memory, and said output device; and
   at least one programmable logic device connected to said main processor via a plurality of input/output connections in said device for connecting signals on said programmable logic device to elements of said system, comprising:
   a plurality of logic array blocks (LABs), arranged in a plurality of rows and columns, at least one LAB having a plurality of inputs and outputs and capable of performing a logic function such that said at least one LAB's outputs each represent logical functions of its inputs, said logic function being programmable during chip manufacture or use;
   a general interconnect structure comprising a plurality of rows of conductors and a plurality of columns of conductors, said general interconnect structure capable of routing select signals between said columns of conductors and said rows of conductors;

LAB output lines for selectively connecting said LAB outputs to said general interconnect structure;

at least one LAB-based interconnect associated with a particular LAB capable of connecting selected lines of said general interconnect to selected input lines of said LAB;

wherein at least one LAB is comprised of a plurality of logic elements, each of said logic elements having an output and a plurality of inputs and each of said logic elements performing a function such that its output is a logical function of its inputs;

a plurality of shared input signals connectable to a plurality of logic elements in at least one logic block; and at least one logic element comprising:
at least two look-up tables said look-up tables having inputs selectively connectable to said inputs of said logic element and having outputs selectively connectable to said output of said logic element.

21. The digital information processing system of claim 20 wherein said general interconnect structure comprises a plurality of rows and columns of conductors and wherein data in said look-up tables is stored in static random access memory and further comprising a plurality of multiplexers with inputs connected to said general interconnect structure and outputs connected to said at least one LAB-based interconnect.

22. The digital information processing system of claim 21 wherein at least one LAB further comprises an enhanced carry chain comprising:
a direct carry output for transmitting a carry signal to an adjacent LAB;
a general interconnect carry output line for selectively connecting the carry output to a line in the general interconnect; and
wherein said at least one LAB-based interconnect associated with at least one LAB includes a plurality of LAB input carry_in lines connectable to a LAB's carry input.

23. A logic element for use in a programmable logic device comprising:
a plurality of unshared input signal lines for selectively connecting inputs of said logic element to a lab-based interconnect and not directly connected to other logic elements;
a plurality of inputs for connecting to shared input signal lines, said shared input signal lines selectively connecting inputs of at least two logic elements within a specific group of logic elements;
first and second look-up tables each having an output and a plurality of inputs and each being programmable such that its output can represent a logical function of its input;
a first input multiplexer with its output coupled to an input of said first look-up table, one input coupled to one of said plurality of unshared input signal lines and a second input coupled to one of said plurality of shared input signal lines;
a second input multiplexer with its output coupled to an input of said first look-up table, one input coupled to one of said plurality of unshared input signal lines and a second input coupled to another of said plurality of unshared input signal lines;
a third input multiplexer with its output coupled to an input of said second look-up table, one input coupled to one of said plurality of unshared input signal lines and a second input coupled to one of said plurality of shared input signal lines; and
an output multiplexer with its output coupled to an output of said logic element, one input coupled to an output of said first look-up table and a second input coupled an output of said second look-up table.

24. The logic element according to claim 23 further comprising:
a fourth input multiplexer with its output coupled to a select signal of said output multiplexer, one input coupled to one of said plurality of unshared input signal lines and a second input coupled to one of said plurality of shared input signal lines.

25. The logic element according to claim 24 further comprising:
a first programmable store coupled to the select signal of said first input multiplexer and said third input multiplexer.

26. The logic element according to claim 25 further comprising:
a second programmable store coupled to the select signal of said second input multiplexer and said fourth input multiplexer.

* * * * *